US006440767B1

(12) United States Patent
Loo et al.

(10) Patent No.: US 6,440,767 B1
(45) Date of Patent: Aug. 27, 2002

(54) MONOLITHIC SINGLE POLE DOUBLE THROW RF MEMS SWITCH

(75) Inventors: Robert Y. Loo, Agoura Hills; James H. Schaffner, Chatsworth; Adele E. Schmitz, Newbury Park; Tsung-Yuan Hsu, Westlake Village; Franklin A. Dolezal, Reseda; Gregory L. Tangonan, Oxnard, all of CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 09/767,321

(22) Filed: Jan. 23, 2001

(51) Int. Cl.[7] ........................ H01L 21/00; H01L 29/82; H01H 57/00; H03K 17/975; H01P 1/10

(52) U.S. Cl. ........................ 438/52; 333/262; 200/181; 200/600; 257/415; 257/419

(58) Field of Search ............................ 438/52; 257/419, 257/415; 333/262, 106, 107; 200/180, 600

(56) References Cited

U.S. PATENT DOCUMENTS 5,121,089 A 6/1992 Larson ....................... 333/107
6,046,659 A 4/2000 Loo et al. ................... 333/262
6,160,230 A * 12/2000 McMillan et al. .......... 200/181
6,307,452 B1 * 10/2001 Sun ............................ 333/262
6,310,526 B1 * 10/2001 Yip et al. ................... 333/262

* cited by examiner

*Primary Examiner*—John F. Niebling
*Assistant Examiner*—Viktor Simkovic
(74) *Attorney, Agent, or Firm*—Ladas & Parry

(57) ABSTRACT

Apparatus for a micro-electro-mechanical switch that provides single pole, double throw switching action. The switch comprises a single RF input line and two RF output lines. The switch additionally comprises two armatures, each mechanically connected to a substrate at one end and having a conducting transmission line at the other end with a suspended biasing electrode located on top of or within a structural layer of the armature. Each conducting transmission line has conducting dimples that protrude beyond the bottom of the armature carrying the conducting transmission line. Closure of an armature causes the dimples of the corresponding conducting transmission line to mechanically and electrically engage the RF input line and the corresponding RF output line, thus directing RF energy from the RF input line to the selected RF output line.

20 Claims, 5 Drawing Sheets

MONOLITHIC SINGLE POLE DOUBLE THROW RF MEMS SWITCH

BACKGROUND OF THE INVENTION

1. Technical Field of the Invention

The present invention relates generally to switches. More particularly, it relates to the design and fabrication of micro-fabricated electromechanical switches having a single pole double throw configuration.

2. Description of Related Art

In communications applications, switches are often designed with semiconductor elements such as transistors or pin diodes. At microwave frequencies, however, these devices suffer from several shortcomings. PIN diodes and transistors typically have an insertion loss greater than 1 dB, which is the loss across the switch when the switch is closed. Transistors operating at microwave frequencies tend to have an isolation value of under 20 dB. This allows a signal to 'bleed' across the switch even when the switch is open. PIN diodes and transistors have a limited frequency response and typically only respond to frequencies under 20 GHz. In addition, the insertion losses and isolation values for these switches varies depending on the frequency of the signal passing through the switches. These characteristics make semiconductor transistors and pin diodes a poor choice for switches in microwave applications.

U.S. Pat. No. 5,121,089 issued Jun. 9, 1992 to Larson discloses a microwave micro-electro-mechanical systems (MEMS) switch. The Larson MEMS switch utilizes an armature design. One end of a metal armature is affixed to an output line, and the other end of the armature rests above an input line. The armature is electrically isolated from the input line when the switch is in an open position. When a voltage is applied to an electrode below the armature, the armature is pulled downward and contacts the input line. This creates a conducting path between the input line and the output line through the metal armature. This switch also provides only a Single Pole, Single Throw (SPST) function, that is, the switch is either open or closed.

U.S. Pat. No. 6.046,659 of Loo et al. discloses methods for the design and fabrication of SPST MEMS switches. Each MEMS switch has a multiple-layer armature with a suspended biasing electrode and a conducting transmission line affixed to the structural layer of the armature. A conducting dimple is connected to the conducting line to provide a reliable region of contact for the switch. The switch is fabricated using silicon nitride as the armature structural layer and silicon dioxide as a sacrificial layer supporting the armature during fabrication. Hydrofluoric acid is used to remove the silicon dioxide layer with post-processing in a critical point dryer to increase yield.

A MEMS switch has a very low insertion loss (less than 0.2 dB at 45 GHz) and a high isolation when open (greater than 30 dB) over a large bandwidth when compared to semiconductor transistors and pin diodes. These characteristics give the MEMS switch the potential to not only replace traditional narrow-bandwidth PIN diodes and transistor switches in microwave circuits, but to create a whole new class of high performance and compact microwave switch circuits.

A common feature of the MEMS switches described above is that they all disclose a single pole, single throw (SPST) configuration, that is, they can only switch an RF signal on or off. However, RF signals often must be switched between two destinations, such as when switching an RF signal between a first antenna array and a second antenna array. Switches that support this configuration are classified as single pole, double throw (SPDT) switches.

SPDT switches known in the art are either solid-state devices or mechanical relays. Solid-state SPDT RF switches, such as PIN diodes and FETs, suffer from the limited frequency response, insertion loss, and isolation problems described above. Isolation between the two output ports of the SPDT switch is of particular concern, since coupling of the signal from one output port to the other output port limits the effectiveness of the switch as a dual output port device. Mechanical relays are also available in SPDT configurations, but they are generally quite large, compared to other RF components, and consume significant amounts of power.

Therefore, there is a need in the art for a SPDT switch that provides low insertion loss and high isolation at its output ports. There is a further need to provide such a switch with a size near to that of other RF components and consumes little power.

SUMMARY OF THE INVENTION

The present invention relates to a method of design and fabrication of a micro-electro-mechanical single pole double throw (SPDT) switch. The switch is preferably designed with a pair of bi-layer or tri-layer armatures which give the switch superior mechanical qualities. The switch is arranged such that one armature of the pair of armatures is normally closed while the other armature is normally open due to the application of an electrostatic potential which operates on one of the two armatures. In addition, the switch preferably has conducting dimples with defined contact areas to provide improved contact characteristics.

One embodiment of the invention is a micro-electro-mechanical switch comprising an input line, two output lines, and a pair of armatures. The input line and the output lines are located on top of a substrate. The armatures are each made of at least one structural layer, a conducting transmission line on top of, below, or between the structural layers, and a suspended armature bias electrode similarly placed of each armature. One end of the structural layer is connected to the substrate, and a substrate bias electrode is located on top of the substrate below the suspended armature bias electrode on the armatures.

The input line is coupled to a pair of input contacts, each contact of the pair of contacts being associated with one of the armatures of the pair of armatures. The output lines are each coupled to an output contact, each output contact being associated with one of the armatures of the pair of armatures. A first end of the conducting transmission line in each armature rests above each of the input contacts and a second end rests above each of the output contacts when the switch is in an open position. Each conducting transmission line also contains a conducting dimple at both the first end and the second end such that the distance between the conducting dimple and the input and output contacts is less than the distance between the conducting transmission line and the input and output contacts so that the conducting dimples contact the input and output contacts when the switch is in the closed position. The structural layer may be formed below, above, or both above and below the conducting transmission line. The input line, output lines, input contacts, output contacts, armature bias pad, substrate bias pad, and substrate bias electrode are comprised of a stack of films referred to as the first metal layer which is preferably comprised of a 1500 angstrom film of gold on top of a 100 angstrom film of nickel on top of a 900 angstrom film of gold germanium. The armature bias electrodes, conducting transmission lines, and contact dimples are made of a film stack referred to as the second metal layer, which is preferably comprised of a 1000 angstrom film of deposited or evaporated gold on top of a 200 angstrom layer of titanium. The first and second metal layers have different compositions since the first layer is deposited on the substrate while the second layer is deposited on a dielectric, such as silicon nitride.

The present invention may also be embodied in a process for making a micro-electro-mechanical switch. The process comprises a first step of depositing a first metal layer onto a substrate to form an input line, a pair of input contacts, a pair of output lines, a pair of output contacts, substrate bias electrodes, substrate bias pads, and armature bias pads. A support layer, also known as a sacrificial layer, is deposited on top of the first metal layer and the substrate, and a beam structural layer is deposited on top of the sacrificial layer. The beam structural layer forms the armature pair with one end of each armature affixed to the substrate opposite its corresponding input contact. The process further comprises the steps of removing a portion of the structural layer and a portion of the support layer to create a dimple mold. Conducting dimples are formed in the dimple mold when the conducting transmission line and suspended armature bias electrodes are fabricated by depositing a second metal layer, such that the suspended armature bias electrode is electrically connected to the armature bias pad. A second structural layer may or may not be deposited on top of the second metal layer for stress matching and thermal stability of the switch. Finally, the sacrificial layer is removed from beneath the armatures to release the armatures and allow the switch to open and close.

The materials and fabrication techniques used for the process comprise standard integrated circuit manufacturing materials and techniques. The sacrificial layer is made of silicon dioxide and is removed by wet etching the silicon dioxide with HF and with post processing in a critical point dryer. The beam structural layer is comprised of silicon nitride. As discussed above, the first metal layer is preferably comprised of a film of gold on top of a film of nickel on top of a film of gold germanium. The second metal layer is preferably comprised of a film of gold on top of film of titanium. A second beam structural layer may be deposited on top of the conducting line such that the conducting line is encased between the first structural layer and the second structural layer. In alternative embodiments of the present invention, the second metal layer is deposited underneath, in between, or on top of the structural layers. If the second metal layer is underneath the structural layers, then a dielectric or insulator is deposited on top of the substrate bias electrodes to prevent electrical shorting to the armature bias electrodes when the switch is in the closed position

BRIEF DESCRIPTION OF THE DRAWINGS

These and other features and advantages will become more apparent from a detailed consideration of the invention when taken in conjunction with the drawings in which.

DETAILED DESCRIPTION OF PREFERRED EMBODIMENTS

Figure 1:
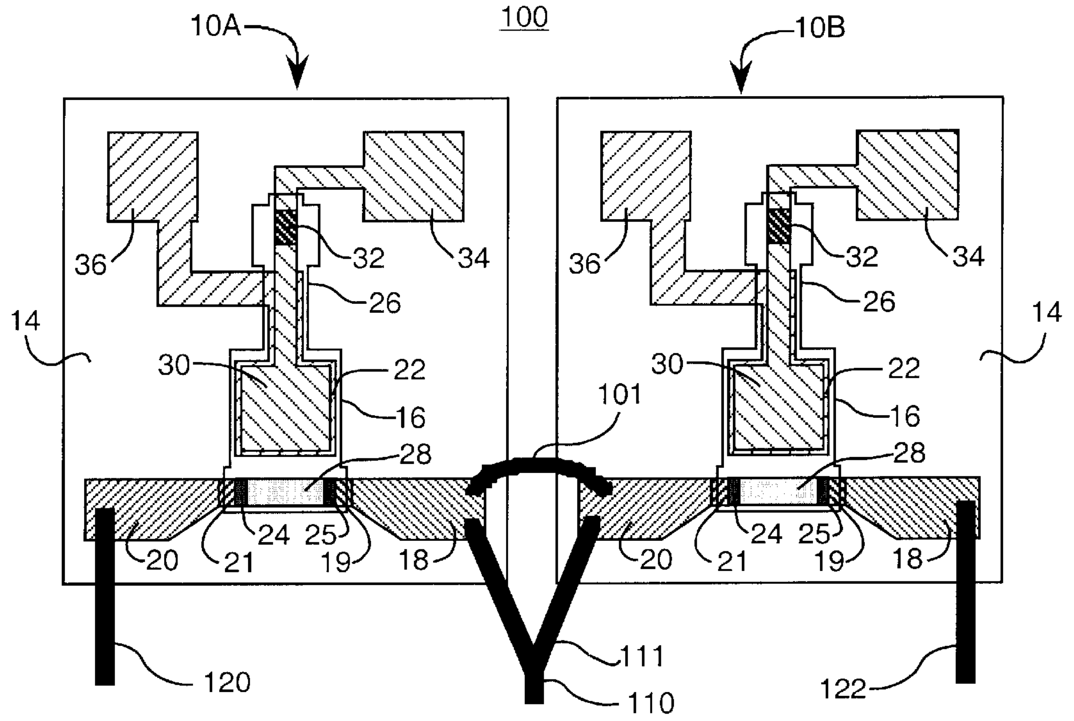
FIG. 1 is a top overview view of two discrete SPST MEMS switches connected in a SPDT configuration.

FIG. 1 is a general overview of a hybrid SPDT switch 100 constructed from two discrete SPST MEMS switches 10A, 10B. The two switches 10A, 10B are identical, so the description below refers to both switches 10A, 10B.

In the switch 10A, 10B, one end of an armature 16 is affixed to the substrate 14 near an armature bias pad 34 on the substrate 14. The other end of the armature 16 is positioned over a left RF contact 21 and a right RF contact 19. A substrate bias electrode 22 is printed on the substrate 14 below the armature 16. The armature 16 contains an armature bias electrode 30 which is electrically isolated from the substrate bias electrode 22 by an air gap (not shown in FIG. 1) and a layer of silicon nitride (not shown in FIG. 1), when the switch 10A, 10B is in an open position. When the switch 10A, 10B is in a closed position, the layer of silicon nitride still serves to electrically isolate the armature bias electrode 30 from the substrate bias electrode.

A right conducting dimple 25 and a left conducting dimple 24 protrude from the armature 16 toward the left RF contact 21 and the right RF contact 19. A conducting RF line 28 is printed on the armature 16 and electrically connects the right conducting dimple 25 to the left conducting dimple 24. When the MEMS switch 10A, 10B is in an open position, the dimples 24, 25 are electrically isolated from the left RF contact 21 and the right RF contact 19 by an air gap. The left RF contact 21 and the right RF contact 19 are isolated from each other by a nonmetallic gap in the substrate 14. The left RF contact 21 is electrically connected to a left RF line 20 and the right RF contact 19 is electrically connected to a right RF line 18.

The armature 16 is comprised of a beam structural layer 26, the conducting line 28, suspended armature bias electrode 30, and via hole 32. The armature bias electrode 30 is encapsulated within the beam structural layer 26 and extends over the majority of the armature 16. The armature bias electrode 30 connects to the armature bias pad 34 through metal deposited in the via hole 32. The substrate bias electrode 22 is in electrical contact with a substrate bias pad 36. The substrate bias pad 36 and the substrate bias electrode 22 may comprise a single layer of deposited metal. When a voltage is applied between the suspended armature bias electrode 30 and the substrate bias electrode 22, an electrostatic attractive force will pull the suspended armature bias electrode 30 as well as the attached armature 16 towards the substrate bias electrode 22, so that the right conducting dimple 25 touches the right RF contact 19 and the left conducting dimple 24 touches the left RF contact 21. Since the RF conducting line 28 electrically connects the right conducting dimple 25 to the left conducting dimple 24, the conducting line 28 and the dimples 24, 25 bridge the gap between the right RF contact 19 and the left RF contact 21, thereby closing the MEMS switch 10A, 10B. The RF conducting line 28 is electrically isolated from the armature bias electrode 30, so the voltage applied to the armature bias electrode 30 is isolated from the RF signal carried through the RF conducting line 28.

In the hybrid SPDT switch 100, an electrical connection 101 is used to connect the right RF line 18 of the first MEMS switch 10A to the left RF line 20 of the second MEMS switch 10B. The electrical connection 101 may comprise a wirebond, a solder line, or other electrical connecting means known in the art. Thus, in the SPDT configuration, the right RF line 18 of the first switch 10A and the left RF line 20 of the second switch 10B comprise the input port 110 of the SPDT switch 100. RF energy may be provided to the input port 110 by connecting to either the right RF line 18 of the first MEMS switch 10A or the left RF line 20 of the second MEMS switch 10B, or, as shown in FIG. 1, using a "Y" connection 11 to connect input RF energy to both the right RF line 18 and the left RF line 20. The left output port 120 of the hybrid SPDT switch 100 is electrically connected to the left RF line 20 of the first MEMS switch 10A and the right output port 122 is electrically connected to the right RF line 18 of the second MEMS switch 10B.

The hybrid SPDT switch 100 operates by either opening the first switch 10A and simultaneously closing the second 10B, or vice versa. If the first switch 10A is opened and the second 10B is closed, RF energy will be directed out of the second output port 122. If the first switch 10A is closed and the second 10B opened, RF energy will be directed out of the first output port 120.

Figure 2A:
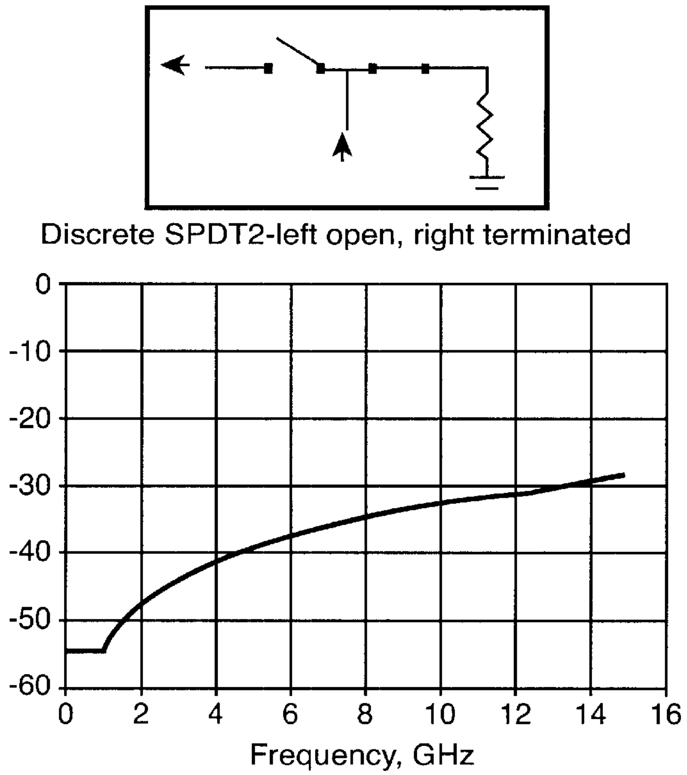
FIG. 2A shows the isolation achieved with the SPDT switch depicted in FIG. 1.
Figure 2B:
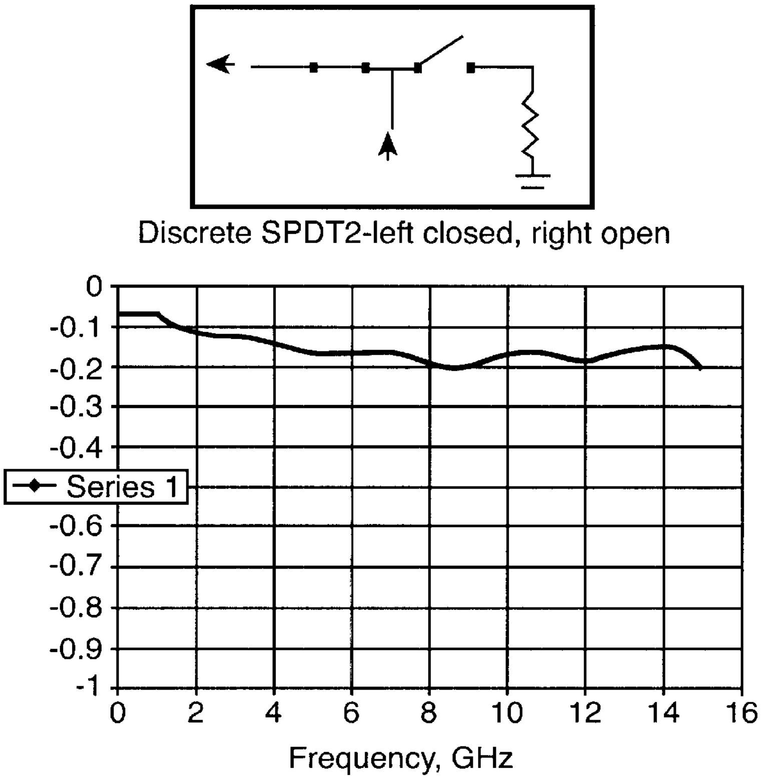
FIG. 2B shows the insertion loss achieved with the SPDT switch depicted in FIG. 1.

FIG. 2A shows the isolation achieved between the input port 110 and an output port 120 of the first switch 10A when the second switch 10B is in the closed position and the second output port 122 is connected to a matched load. Note at frequencies lower than 14 GHz, the isolation is greater than 30 dB. In RF circuits, it is usually desirable to have RF isolation exceed 30 dB. FIG. 2B shows the insertion loss seen with the hybrid SPDT switch 100 described above. As shown in FIG. 2B, the insertion loss does not exceed 0.2 dB, which is generally acceptable performance.

Creation of a hybrid MEMS SPDT switch by combining two discrete MEMS SPST switches has some serious drawbacks. The first major drawback is the fabrication process for the hybrid MEMS SPDT switch requires an additional manufacturing step of electrically connecting together the two discrete MEMS SPDT switches. Another drawback, as illustrated in FIG. 2A, is that the RF isolation provided by the switch suffers due to RF coupling between the two output ports, caused by the wirebond that couples the two switches. A further drawback is that the size of the switch is essentially twice the size of the two individual SPST switches.

Figure 3:
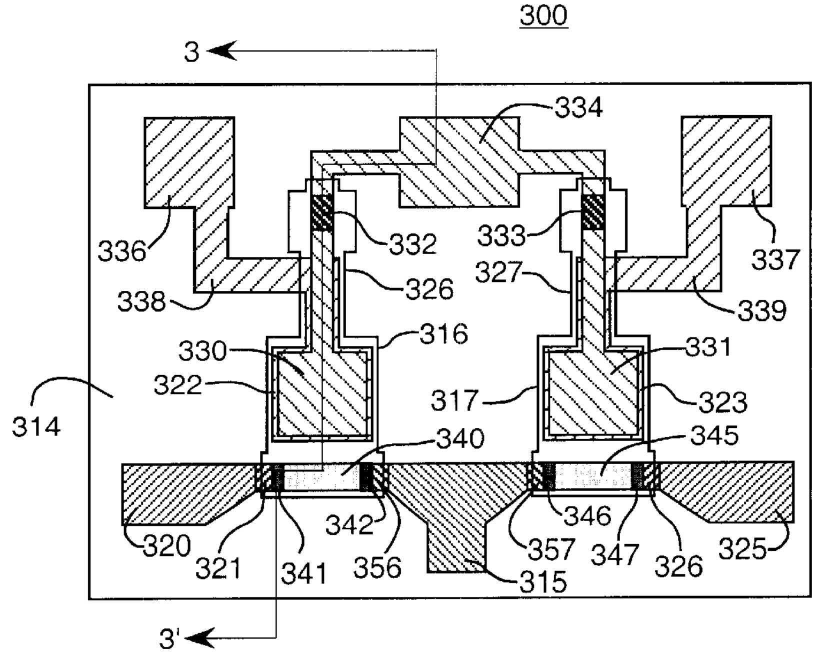
FIG. 3 is a top overview of the monolithic SPDT MEMS switch embodying the present invention.

A monolithic SPDT switch provides for improved operation over that provided by the hybrid MEMS switch described above. A monolithic MEMS SPDT switch is based upon the simultaneous fabrication of two SPST switches in a side-by-side configuration on the same substrate. A general overview of a MEMS SPDT switch 300 according to the present invention is shown in FIG. 3. The MEMS SPDT switch 300 shown in FIG. 3 contains many features similar to those depicted and described for the hybrid MEMS SPDT switch 100 discussed above. Thus, materials and techniques used for constructing the hybrid MEMS SPDT switch 100 described above may also be used be in the construction of the monolithic MEMS SPDT switch 300 according to the present invention.

One end of a first armature 316 is affixed to the substrate 314 near an armature bias pad 334 on the substrate 314. Similarly, one end of a second armature 317 is also affixed to the substrate 314 near the armature bias pad 334 on the substrate 314. The other end of the first armature 316 is positioned over a left input contact 356 and a left output contact 321. The other end of the second armature 317 is positioned over a right input contact 357 and a right output contact 326. The first armature 316 and second armature 317 may be oriented in a parallel direction to each other so that they project above the substrate 314 in the same direction. The left output contact 321 is electrically connected to a left RF output line 320. The left output contact 321 and the left RF output line 320 may be constructed as a single metal structure. Similarly, the right output contact 326 is connected to a right RF output line 325, and may also be a single metal structure. The left input contact 356 and the right input contact 357 are both electrically connected to an RF input line 315. The left input contact 356, the right input contact 357, and the RF input line 315 may also be a single metal structure.

A first substrate bias electrode 322 is printed on the substrate 314 below the first armature 316 and a second substrate bias electrode 323 is printed on the substrate below the second armature 317. The first armature 316 contains a first armature bias electrode 330, preferably encapsulated with a first beam structural layer 326. Similarly, the second armature 317 contains a second armature bias electrode 331, preferably encapsulated within a second beam structural layer 327. Both the first armature bias electrode 330 and the second armature bias electrode 331 are electrically isolated from their corresponding substrate bias electrodes 322, 323 by an air gap (not shown in FIG. 3) and a dielectric layer (not shown in FIG. 3), preferably silicon nitride, beneath the armature bias electrodes 330, 331 within the beam structural layers 326, 327 when the armatures 316, 317 are in an open position. When the armatures 316, 317 are in a closed position, the dielectric layer beneath the armature bias electrodes 330, 331, provides electrical isolation from the substrate bias electrodes 322, 323.

A first substrate bias electrode pad 336 is electrically connected to the first substrate bias electrode 322 by a first metal path 338. Preferably, the first substrate bias electrode pad 336, the first substrate bias electrode 322, and the first metal path 338 comprise a single metal structure, which may be formed by depositing a single metal layer on the substrate 314. A second substrate bias electrode pad 337 is electrically connected to the second substrate bias electrode 323 by a second metal path 339. Preferably, the second substrate bias electrode pad 337, the second substrate bias electrode 323, and the second metal path 339 comprise a single metal structure, which may be formed by depositing a single metal layer on the substrate 314.

A left input conducting dimple 342 and a left output conducting dimple 341 protrude from the first armature 316 toward the left RF input contact 356 and the left RF output contact 321. A first conducting transmission line 340 is printed on the first armature 316 and electrically connects the left input conducting dimple 342 to the left output conducting dimple 341. When the first armature 316 is in an open position, the conducting dimples 341, 342 are electrically isolated from the left RF input contact 356 and the left RF output contact 321 by an air gap. The left RF input contact 356 and the left RF output contact 321 are separated from each other on the substrate 314 by a nonconducting gap.

The first armature 316 is comprised of the first beam structural layer 326, the first conducting transmission line 340, the first suspended armature bias electrode 330, and a first via hole 332. The first armature bias electrode 330 may be encapsulated within the first beam structural layer 326 so that dielectric material covers both the top and bottom of the first armature bias electrode 330. The first armature bias electrode 330 extends over the majority of the first armature 316, but the first armature bias electrode 330 is electrically isolated from the first conducting transmission line 340. The first armature bias electrode 330 connects to the armature bias pad 334 through metal deposited in the first via hole 332. When a voltage is applied between the first suspended armature bias electrode 330 and the first substrate bias electrode 322, an electrostatic attractive force will pull the first suspended armature bias electrode 330 as well as the attached first armature 316 towards the first substrate bias electrode 322, such that the left input conducting dimple 342 touches the left input contact 356 and the left output conducting dimple 341 touches the left output contact 321. Since the conducting line 340 is fabricated to electrically connect the left input conducting dimple 342 to the left output conducting dimple 341, the conducting line 340 and the dimples 341, 342 bridge the gap between the RF input line 315 and the left RF output contact line 320, thereby directing RF energy applied to the RF input line 315 to the left RF output line 320.

Similarly, a right input conducting dimple 346 and a right output conducting dimple 347 protrude from the second armature 317 toward the right RF input contact 357 and the right RF output contact 326. A second conducting transmission line 345 is printed on the second armature 317 and electrically connects the right input conducting dimple 346 to the right output conducting dimple 347. When the second armature 317 is in an open position, the conducting dimples 346, 347 are electrically isolated from the right RF input contact 357 and the right RF output contact 326 by an air gap. The right RF input contact 357 and the right RF output contact 326 are separated from each other on the substrate 314 by a nonconducting gap.

The second armature 317 is comprised of a second beam structural layer 327, the second conducting transmission line 345, a second suspended armature bias electrode 331, and a second via hole 333. The second armature bias electrode 331 may be encapsulated within the second beam structural layer 327 so that dielectric material covers both the top and bottom of the second armature bias electrode 331. The second armature bias electrode 331 extends over the majority of the second armature 317, but the second armature bias electrode 331 is electrically isolated from the second conducting transmission line 345. The second armature bias electrode 331 connects to the armature bias pad 334 through metal deposited in the second via hole 333. When a voltage is applied between the second suspended armature bias electrode 331 and the second substrate bias electrode 323, an electrostatic attractive force will pull the second suspended armature bias electrode 331 as well as the attached second armature 317 towards the second substrate bias electrode 323, such that the right input conducting dimple 346 touches the right RF input contact 357 and the right output conducting dimple 347 touches the right RF output contact 326. Since the second conducting line 345 is fabricated to electrically connect the right input conducting dimple 347 to the right output conducting dimple 347, the second conducting line 345 and the dimples 346, 347 bridge the gap between the right RF input contact 357 and the right RF output contact 326, thereby directing RF energy applied to the RF input line 315 to the right RF output line 325.

The substrate 314 may be comprised of a variety of materials. If the monolithic MEMS switch 300 is intended for use with semiconductor devices, it is preferable to use a semiconducting substance such as gallium arsenide (GaAs) for the substrate 314. This allows the circuit elements as well as the MEMS switch 300 to be fabricated simultaneously on the same substrate using standard integrated circuit fabrication technology such as metal sputtering and masking. For low-noise HEMT MMIC (high electron mobility transistor monolithic microwave integrated circuit) applications, indium phosphide (InP) can be used as the substrate 314. Other possible substrate materials include high resistivity silicon, various ceramics, or quartz. The flexibility in the fabrication of the monolithic MEMS switch 300 allows the switch 300 to be used in a variety of circuits. This reduces the cost and complexity of circuits designed using the present MEMS switch.

Figure 4A:
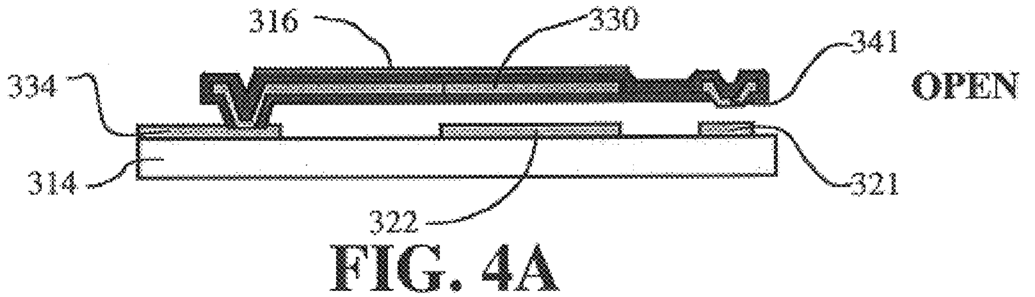
FIG. 4A is a side view of the monolithic SPDT MEMS switch depicted in FIG. 3 taken along the section line 3–3' showing one armature in an open position.
Figure 4B:
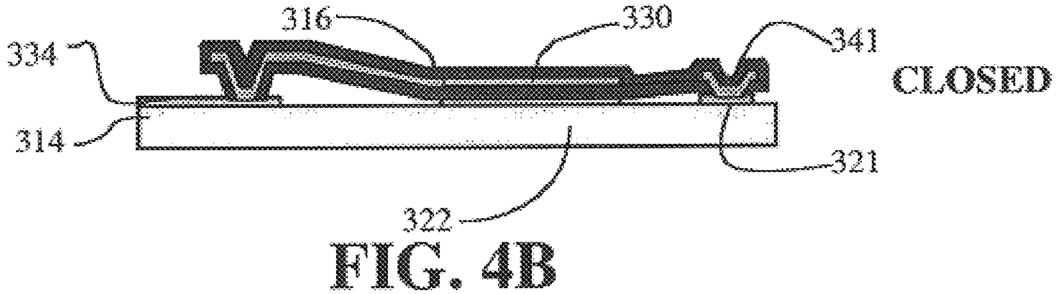
FIG. 4B is a side view of the monolithic SPDT MEMS switch depicted in FIG. 3 taken along the section line 3–3' showing one armature in a closed position.

The gaps between the dimples 341, 342, 346, 347 and the input and output contacts 356, 357, 321, 326 are smaller than the gap between the armatures 316, 317 and the substrate 314, as shown in FIG. 4A. When actuated by electrostatic attraction, an armature 316, 317 bends towards the substrate 314. First, the dimples 341, 342, 346, 347 contact their corresponding input and output contacts 356, 357, 321, 326 at which point the armature 316, 317 bends to allow the suspended armature bias electrode 330, 331 to rest directly above the substrate bias electrode 322, 323, but isolated from the substrate bias electrode 322, 323 by dielectric material in the beam structural layer. This fully closed state is shown in FIG. 4B. The force of the metallic contact between the dimples 341, 342, 346, 347 and the input and output contacts 356, 357, 321, 326 is thus primarily dependent on the flexibility of the armature 316, 317 and the geometry of the dimples and not on the attractive forces of the armature electrode 330, 331 to the substrate electrode 322, 323.

The first beam structural layer 326 is the primary support of the first armature 316 and the second beam structural layer is the primary support of the second armature 317. The first armature electrode 330 and the second armature electrode 331 are printed either on top of the corresponding beam structural layers 326, 327 or are encapsulated within the beam structural layers 326, 327. The beam structural layer 326, 327 is made from a stress-free material such as silicon nitride. The multiple layer design of the armature electrode 330, 331 encapsulated within a resilient structural layer 326, 327 gives each armature 316, 317 enhanced mechanical properties.

Figure 7:
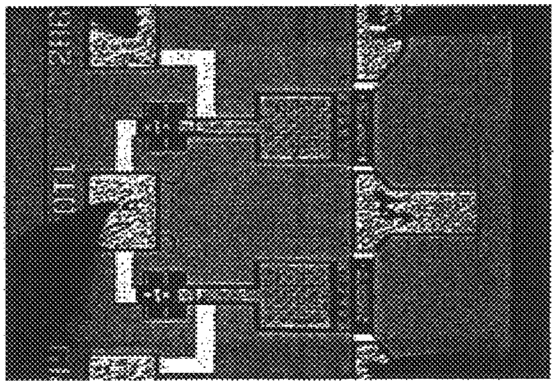
FIG. 7 is a picture of one embodiment of a monolithic SPDT RF MEMS switch according to the present invention.
Figure 5A:
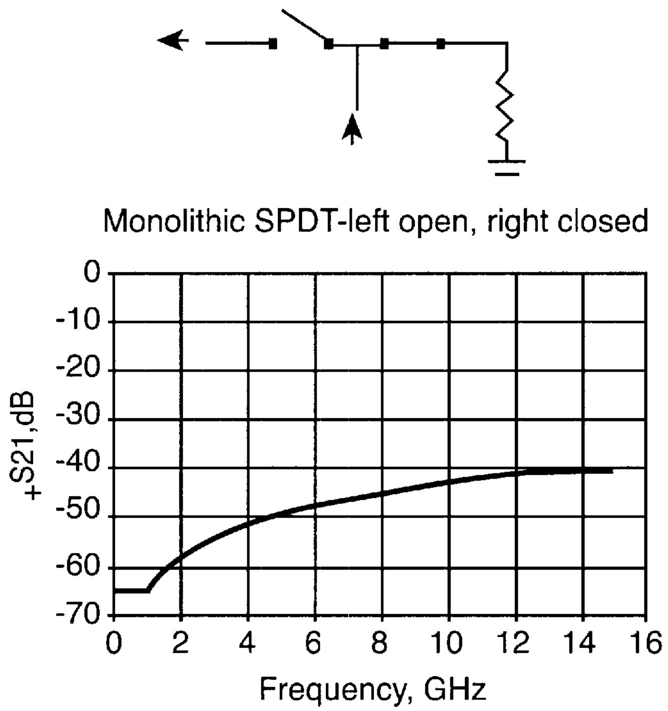
FIG. 5A shows the isolation achieved with the monolithic MEMS SPDT switch according to the present invention
Figure 5B:
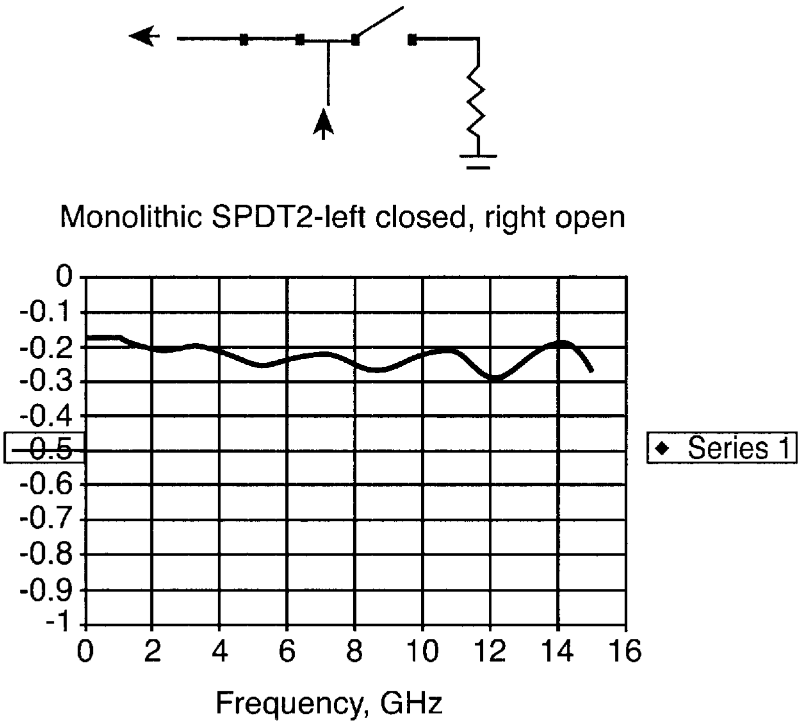
FIG. 5B shows the insertion loss achieved with the monolithic MEMS SPDT switch according to the present invention.

An embodiment of a monolithic SPDT RF MEMS switch according to the present invention is pictured in FIG. 7. A monolithic SPDT switch according to the present invention provides significantly better performance than the hybrid switch discussed above. Isolation and insertion loss data for the switch shown in FIG. 7 is presented in FIGS. 5A and 5B. As shown in FIG. 5A, the isolation provided by the switch is 40 dB or greater below 15 GHZ. Hence, the monolithic SPDT switch provides an improvement of up to 10 dB in isolation over the hybrid SPDT switch. The monolithic switch does not suffer from increased insertion loss. As shown in FIG. 5D, the insertion loss is less than 0.3 dB for frequencies below 15 GHz.

A layer of $SiO_2$ is used to support the armature 316, 317 during the fabrication of the MEMS switch 300, but it is removed in the last fabrication step, hence its term "sacrificial layer." It is necessary to remove this sacrificial $SiO_2$ layer in order to free each armature 316, 317 such that they are free to deflect out of plane of the substrate 314. An HF etchant solution is typically used, and openings in the beam structural layers 326, 327 allow the HF to etch the sacrificial layer beneath the armatures 316, 317 in this last fabrication step as discussed below in conjunction with FIGS. 6E and 6F.

FIGS. 6A–6F illustrate the manufacturing processes embodying the present invention used to fabricate the monolithic MEMS switch 300 of FIGS. 3, 4 and 7. FIGS. 6A–6F present a profile of the switch taken along the section line 3—3' of FIG. 3. Therefore, FIGS. 6A–6F specifically illustrate the steps required to fabricate the structures associated with the first armature 316. However, the structures associated with both the first armature 316 and the second armature 317 may be fabricated simultaneously in the monolithic MEMS switch 300. Therefore, the process discussion below addresses the steps used to fabricate the entire monolithic MEMS switch 300.

The process begins with a substrate 314. In a preferred embodiment, GaAs is used as the substrate. Other materials may be used, however, such as InP, ceramics, quartz or silicon. The substrate is chosen primarily based on the technology of the circuitry the MEMS switch is to be connected to so that the MEMS switch and the circuit may be fabricated simultaneously. For example, InP can be used for low noise HEMT MMICS (high electron mobility transistor monolothic microwave integrated circuits) and GaAs is typically used for PHEMT (pseudomorphic HEMT) power MMICS.

Figure 6A:
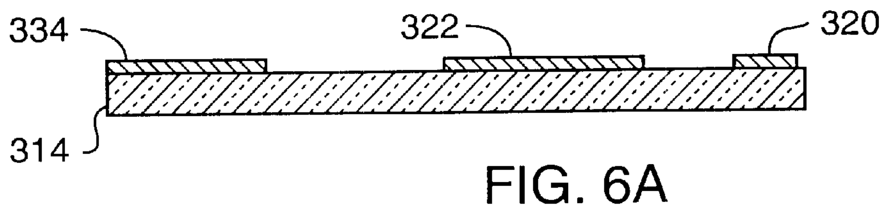
FIGS. 6A–6F are side elevational views of the monolithic MEMS SPDT switch of FIG. 3 taken along section line 3–3' during progressive steps of a fabrication process further embodying the present invention.

FIG. 6A shows a profile of the MEMS switch 300 after the first step of depositing a metal 1 layer onto the substrate 314 for the armature bias pad 334, substrate bias electrode pads 336, 337 (not shown in FIG. 6A), the output lines 320, 325, the input line 315 (not shown in FIG. 6A) and the substrate bias electrodes 322, 323 is complete. The metal 1 layer may be deposited lithographically using standard integrated circuit fabrication technology, such as resist lift-off or resist definition and metal etch. In the preferred embodiment, gold (Au) is used as the primary composition of the metal 1 layer. Au is preferred in RF applications because of its low resistivity. In order to ensure the adhesion of the Au to the substrate, a 900 angstrom layer of gold germanium is deposited, followed by a 100 angstrom layer of nickel, and finally a 1500 angstrom layer of gold. The thin layer of gold germanium (AuGe) eutectic metal is deposited to ensure adhesion of the Au by alloying the AuGe into the semiconductor similar to a standard ohmic metal process for any III–V MESFET or HEMT.

Figure 6B:
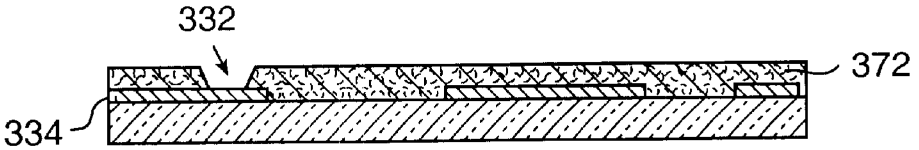

Next, as shown in FIG. 6B, a support layer 372 is placed on top of the Au and etched so that the armatures 316, 317 may be produced above the support layer 372. The support layer 372 is typically comprised of 2 microns of $SiO_2$ which may be sputter deposited or deposited using PECVD (plasma enhanced chemical vapor deposition). Vias 332, 333 are etched in the sacrificial layer 372 so that the metal of the armature bias pad 334 is exposed. The vias 332, 333 definition may be performed using standard resist lithography and etching of the support layer 372. Other materials besides $SiO_2$ may be used as a sacrificial layer 372. The important characteristics of the sacrificial layer 372 are a high etch rate, good thickness uniformity, and conformal coating by the oxide of the metal already on the substrate 314. The thickness of the oxide partially determines the thickness of the switch opening, which is critical in determining the voltage necessary to close the switch as well as the electrical isolation of the switch when the switch is open. The sacrificial layer 372 will be removed in the final step to release the armatures 316, 317, as shown in FIG. 6F.

Another advantage of using $SiO_2$ as the support layer 372 is that $SiO_2$ can withstand high temperatures. Other types of support layers, such as organic polyimides, harden considerably if exposed to high temperatures. This makes the polyimide sacrificial layer difficult to later remove. The support layer 372 is exposed to high temperatures when the silicon nitride for the beam structural layers 326, 327 is deposited, as a high temperature deposition is desired when depositing the silicon nitride to give the silicon nitride a lower HF etch rate.

Figure 6C:
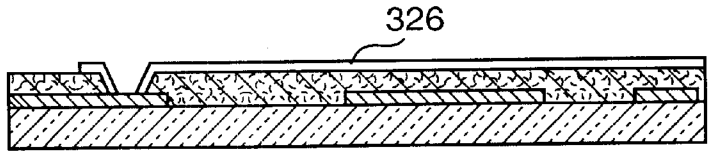

FIG. 6C shows the fabrication of the beam structural layers 326, 327. The beam structural layers 326, 327 are the supporting mechanism of the armatures 316, 317 and are preferably made out of silicon nitride, although other materials besides silicon nitride may be used. Silicon nitride is preferred because it can be deposited so that there is neutral stress in the beam structural layers 326, 327. Neutral stress fabrication reduces the bowing that may occur when the switch is actuated. The material used for the structural layers 326, 327 must have a low etch rate compared to the support layer 372 so that the structural layers 326, 327 are not etched away when the sacrificial layer 372 is removed to release the armatures 316, 317. The structural layers 326, 327 are patterned and etched using standard lithographic and etching processes.

The beam structural layers 326, 327 may be formed only below the armature bias electrodes 330, 331. If the beam structural layer 326, 327 are fabricated only below the first armature bias electrodes 330, 331, bowing will occur in the armatures 316, 317 when the switch is actuated, if the stresses in the structural layers 326, 327 differs from the stresses in the armature bias electrodes 330, 331. The armatures 316, 317 will bow either upwards or downwards, depending upon which material has the higher stress. Bowing can change the voltage required to activate the switch and, if the bowing is severe enough, can prevent the switch from either opening (bowed downward) or closing (bowed upward) regardless of the actuating voltage.

The beam structural layers 326, 327 may also be formed both above and below the armature bias electrodes 330, 331 to minimize the bowing in the armatures 316, 317. By fabricating the beam structural layers 326, 327 on both sides of the armature bias electrodes 330, 331, the effect of different material stress is minimized because the portions of the beam structural layers 326, 327 that are above the armature bias electrodes 330, 331 will flex in the same manner as the portions of the beam structural layers 326, 327 that are below the armature bias electrodes 330, 331. The armature bias electrodes 330, 331 are constrained by the structural layers 326, 327 and will therefore flex with the structural layers 326, 327 so that the bowing in the switch is minimized.

Figure 6D:
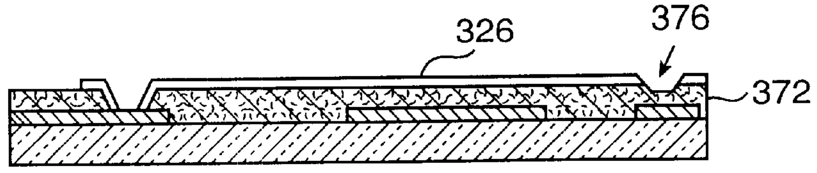
Figure 6E:
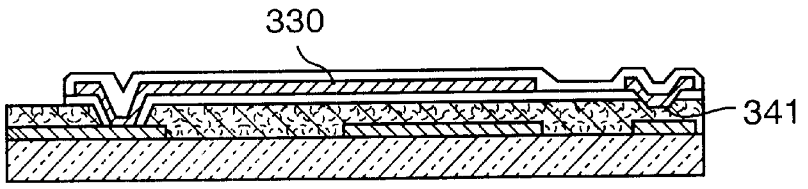
Figure 6F:
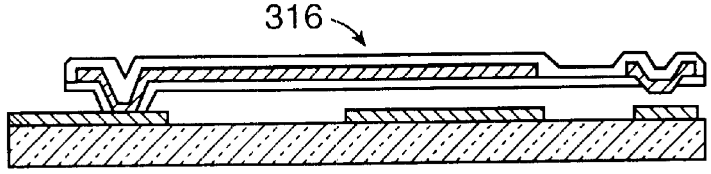

In FIG. 6D, dimple receptacles 376 are etched into the beam structural layers 326, 327 and the support layer 372. The dimple receptacles 376 are openings where the conducting dimples 341, 342, 346, 347 will later be deposited, as shown in FIG. 6E. The dimple receptacles 376 are created using standard lithography and a dry etch of the beam structural layers 326, 327, followed by a partial etch of the support layer 372. The openings in the structural layers 326,

327 allow the dimples 341, 342, 346, 347 to protrude through the structural layers 326, 327.

Next, as shown in FIG. 6E, a metal 2 layer is deposited onto the beam structural layers 326, 327. The metal 2 layer forms the suspended armature bias electrodes 330, 331, the conducting transmission lines 340, 345 (not shown in FIG. 6E), and the dimples 341, 342, 346, 347. In the preferred embodiment, the metal 2 layer is comprised of a sputter deposition of a thin film (200 angstroms) of Ti followed by a 1000 angstrom deposition of Au. The metal 2 layer must be conformal across the wafer and acts as a plating plane for the Au. The plating is done by using metal 2 lithography to open up the areas of the switch that are to be plated. The Au is electroplated by electrically contacting the membrane metal on the edge of the wafer and placing the metal 2 patterned wafer in the plating solution. The plating occurs only where the membrane metal is exposed to the plating solution to complete the electrical circuit and not where the electrically insulating resist is left on the wafer. After 2 microns of Au is plated, the resist is stripped off of the wafer and the whole surface is ion milled to remove the membrane metal. Some Au will also be removed from the top of the plated Au during the ion milling, but that loss is minimal because the membrane is only 1200 angstroms thick.

The result of this process is that the conducting transmission lines 340, 345 and the dimples 341, 342, 346, 347 are created in the metal 2 layer, primarily Au in the preferred embodiment. In addition, the Au fills the vias 332, 333 and connects the armature bias electrodes 330, 331 to the armature bias pad 334. Au is a preferred choice for metal 2 because of its low resistivity. When choosing the metal for the metal 2 layer and the material for the beam structural layers 326, 327, it is important to select the materials such that the stress of the beam structural layers 326, 327 such that the armatures 316, 317 will not bow upwards or downwards when actuating. This is done by carefully determining the deposition parameters for the structural layer. Silicon nitride was chosen for this structural layer not only for its insulating characteristics but in large part because of the controllability of these deposition parameters and the resultant stress levels of the film.

The beam structural layers 326, 327 are then lithographically defined and etched to complete the switch fabrication. Finally, the sacrificial layer 372 is removed to release the armature 316, as shown in FIG. 6F.

If the sacrificial layer 372 is comprised of $SiO_2$, then it will typically be wet etched away in the final fabrication sequence by using a hydrofluoric acid (HF) solution. The etch and rinses are performed with post-processing in a critical point dryer to ensure that the armatures 316, 317 do not come into contact with the substrate 314 when the sacrificial layer 372 is removed. If contact occurs during this process, device sticking and switch failure are likely. Contact is prevented by transferring the switch from a liquid phase (e.g. HF) environment to a gaseous phase (e.g.air) environment not directly, but by introducing a supercritical phase in between the liquid and gaseous phases. The sample is etched in HF and rinsed with DI water by dilution, so that the switch is not removed from a liquid during the process. DI water is similarly replaced with ethanol. The sample is transferred to the critical point dryer and the chamber is sealed. High pressure liquid $CO_2$ replaces the ethanol in the chamber, so that there is only $CO_2$ surrounding the sample. The chamber is heated so that the $CO_2$ changes into the supercritical phase. Pressure is then released so that the $CO_2$ changes into the gaseous phase. Now that the sample is surrounded only by gas, it may be removed from the chamber into room air. A side elevational view of the MEMS switch 300 after the support layer 372 has been removed is shown in FIG. 6F.

As can be surmised by one skilled in the art, there are many more configurations of the present invention that may be used other than the ones presented herein. For example, other metals can be used to form the conducting transmission line layer, the bias electrodes and pads, and the input and output lines. Also, the beam structural layer and the sacrificial layer may be fabricated with materials other than silicon nitride and silicon dioxide. It is therefore intended that the foregoing detailed description be regarded as illustrative rather than limiting and that it be understood that it is the following claims, including all equivalents, that are intended to define the scope of this invention.

What is claimed is:

1. A method of switching an RF signal applied at an input port to one of two output ports, comprising the steps of:

providing a monolithic SPDT RF MEMS switch comprising:
- a substrate;
- an input line on top of the substrate;
- a first output line on top of the substrate and separated from the input line;
- a first substrate electrode on top of the substrate, located adjacent to but separated from the input line and the first output line;
- a second output line on top of the substrate and separated from the input line;
- a second substrate electrode on top of the substrate, located adjacent to but separated from the input line and the second output line;
- a first armature comprising:
  - a first armature lower structural layer having a first end mechanically connected to the substrate and a second end positioned over the input line and first output line;
  - a first conducting transmission line located at the second end of the first armature structural layer and suspended above the input line and the first output line; and
  - a first suspended armature electrode disposed above and in contact with the first armature lower structural layer and suspended above the first substrate electrode; and
- a second armature comprising:
  - a second armature lower structural layer having a first end mechanically connected to the substrate and a second end positioned over the input line and the second output line;
  - a second conducting transmission line located at the second end of the second armature structural layer and suspended above the input line and the second output line; and
  - a second suspended armature electrode disposed above and in contact with the second armature lower structural layer and suspended above the second substrate electrode; and connecting the input port to the input line;

connecting one of the output ports to the first output line and the other output port to the second output line; and applying a voltage between a selected one of the two substrate electrodes and the armature electrode suspended above the substrate electrode so as to cause the armature suspended above the selected substrate electrode to close.

2. The method of claim 1, wherein the first suspended armature electrode and the second suspended armature electrode are electrically connected to a common armature electrode pad and the voltage is applied between one of the two substrate electrodes and the common armature electrode pad.

3. The method of claim 1, wherein the armature suspended above the non-selected substrate electrode is in an open position.

4. The method of claim 1, wherein the first transmission line further comprises a first set of one or more contact dimples that project below a bottom surface of the first armature and the second transmission line further comprises a second set of one or more contact dimples that project below a bottom surface of the second armature.

5. The method of claim 4, wherein a gap between the first set of one or more contact dimples and a plane defined by the top of the input line and the first output line is less than a gap between the first armature lower structural layer and the substrate, and wherein the first set of one or more contact dimples mechanically and electrically contact the input line and the first output line when the first armature is in the closed position and a gap between the second set of one or more contact dimples and a plane defined by the top of the input line and the second output line is less than a gap between the second armature lower structural layer and the substrate, and wherein the second set of one or more contact dimples mechanically and electrically contact the input line and the second output line when the second armature is in the closed position.

6. The method of claim 5 wherein the first suspended armature electrode, the second suspended armature electrode, the first set of one or more contact dimples, and the second set of one or more contact dimples each comprise layers of gold and titanium.

7. The method of claim 1 wherein the input pad, the first output pad, the second output pad, the first substrate electrode, the second substrate electrode, the first suspended armature electrode and the second suspended armature electrode each comprise layers of gold, nickel, and gold germanium.

8. The method of claim 1, wherein the monolithic SPDT RF MEMS switch further comprises:

a first armature structural layer disposed above and in contact with the first armature lower structural layer and the first suspended armature electrode; and a second armature structural layer disposed above and in contact with the second armature lower structural layer and the second suspended armature electrode.

9. The method of claim 8, wherein the structural layers comprise silicon nitride.

10. A micro-electro-mechanical switch, comprising a) a substrate;

b) an input line on top of the substrate;

c) a first output line on top of the substrate and separated from the input line;

d) a first substrate electrode on top of the substrate, located adjacent to but separated from the input line and the first output line;

e) a second output line on top of the substrate and separated from the input line;

f) a second substrate electrode on top of the substrate, located adjacent to but separated from the input line and the second output line;

g) a first armature comprising:

1) a first armature lower structural layer having a first end mechanically connected to the substrate and a second end positioned over the input line and first output line;

2) a first conducting transmission line located at the second end of the first armature structural layer and suspended above the input line and the first output line; and 3) a first suspended armature electrode disposed above and in contact with the first armature lower structural layer and suspended above the first substrate electrode; and h) a second armature comprising:

1) a second armature lower structural layer having a first end mechanically connected to the substrate and a second end positioned over the input line and the second output line;

2) a second conducting transmission line located at the second end of the second armature structural layer and suspended above the input line and the second output line; and 3) a second suspended armature electrode disposed above and in contact with the second armature lower structural layer and suspended above the second substrate electrode.

11. The micro-electro-mechanical switch of claim 10 wherein the first conducting transmission line is suspended above the input line and the first output line when the first armature is in an open position, and mechanically and electrically contacts the input line and the first output line when the first armature is in a closed position and the second conducting transmission line is suspended above the input line and the second output line when the second armature is in an open position, and mechanically and electrically contacts the input line and the second output line when the second armature is in a closed position.

12. The micro-electro-mechanical switch of claim 11 wherein the first armature is in a closed position when the second armature is in an open position and the first armature is in an open position when the second armature is in a closed position.

13. The micro-electro-mechanical switch of claim 10 wherein the first suspended armature electrode and the second suspended armature electrode are electrically connected to an armature electrode bias pad.

14. The micro-electro-mechanical switch of claim 10 wherein the first suspended armature electrode is connected to a first armature electrode bias pad and the second suspended armature electrode is electrically connected to a second armature electrode bias pad, and the first and second armature electrode bias pads are electrically isolated from each other.

15. The micro-electro-mechanical switch of claim 10 wherein the first transmission line further comprises a first set of one or more contact dimples that project below a bottom surface of the first armature and the second transmission line further comprises a second set of one or more contact dimples that project below a bottom surface of the second armature.

16. The micro-electro-mechanical switch of claim 15 wherein a gap between the first set of one or more contact dimples and a plane defined by the top of the input line and the first output line is less than a gap between the first armature lower structural layer and the substrate, and wherein the first set of one or more contact dimples mechanically and electrically contact the input line and the first output line when the first armature is in the closed position and a gap between the second set of one or more contact dimples and a plane defined by the top of the input line and the second output line is less than a gap between the second armature lower structural layer and the substrate, and wherein the second set of one or more contact dimples mechanically and electrically contact the input line and the second output line when the second armature is in the closed position.

17. The micro-electro-mechanical switch of claim 16 wherein the first suspended armature electrode, the second suspended armature electrode, the first set of one or more contact dimples, and the second set of one or more contact dimples each comprise layers of gold and titanium.

18. The micro-electro-mechanical switch of claim 10 wherein the input pad, the first output pad, the second output pad, the first substrate electrode, the second substrate electrode, the first suspended armature electrode and the second suspended armature electrode each comprise layers of gold, nickel, and gold germanium.

19. The micro-electro-mechanical switch of claim 10 further comprising:

a first armature structural layer disposed above and in contact with the first armature lower structural layer and the first suspended armature electrode; and a second armature structural layer disposed above and in contact with the second armature lower structural layer and the second suspended armature electrode.

20. The micro-electro-mechanical switch of claim 19, wherein the structural layers comprise silicon nitride.

* * * * *